(12) United States Patent
Park et al.

(10) Patent No.: US 10,805,050 B2
(45) Date of Patent: Oct. 13, 2020

(54) METHOD OF RETRANSMITTING TRANSMISSION BLOCK FOR NEW RADIO AND APPARATUS USING THE SAME

(71) Applicant: KT CORPORATION, Gyeonggi-do (KR)

(72) Inventors: Ki-Hyeon Park, Seoul (KR); Ki-Tae Kim, Seoul (KR); Kyujin Park, Seoul (KR); Woo-jin Choi, Seoul (KR)

(73) Assignee: KT CORPORATION, Gyeonggi-do (KR)

(*) Notice: Subject to any disclaimer, the term of this patent is extended or adjusted under 35 U.S.C. 154(b) by 116 days.

(21) Appl. No.: 15/990,895

(22) Filed: May 29, 2018

(65) Prior Publication Data

US 2018/0351706 A1    Dec. 6, 2018

(30) Foreign Application Priority Data

May 31, 2017  (KR) .................. 10-2017-0067957
Mar. 28, 2018  (KR) .................. 10-2018-0035572

(51) Int. Cl.
*G08C 25/02* (2006.01)
*H04L 1/18* (2006.01)
(Continued)

(52) U.S. Cl.
CPC ...... *H04L 1/1819* (2013.01); *H03M 13/6306* (2013.01); *H04L 1/1614* (2013.01); *H04L 1/1657* (2013.01); *H04L 1/1671* (2013.01); *H03M 13/09* (2013.01); *H03M 13/091* (2013.01); *H04L 5/0055* (2013.01); *H04W 72/042* (2013.01)

(58) Field of Classification Search
CPC ... H04L 1/1819; H04L 1/1657; H04L 1/1671; H04L 1/1614; H04L 1/18; H04L 1/1812; H04L 1/1887; H04L 5/00; H04L 5/0048; H04L 5/0053; H04L 5/0007; H04L 5/001; H04L 1/1854; H04L 5/0055; H03M 13/6306; H03M 13/091; H04W 72/042; H04W 72/12; H04W 28/04; H04W 72/1268; H04W 72/1284
See application file for complete search history.

(56) References Cited

U.S. PATENT DOCUMENTS

2018/0287736 A1* 10/2018 Ren ................ H04L 1/0045
2019/0207734 A1*  7/2019 Yang ............... H04L 5/001
(Continued)

FOREIGN PATENT DOCUMENTS

CN    2017101700334    * 3/2017    ......... H04L 1/1887

OTHER PUBLICATIONS

Huawei et al., "Discussion on CBG-based feedback", R1-1706964, 3GPP TSG RAN WG1 Meeting #89, Hangzhou, China, May 15-19, 2017.
(Continued)

*Primary Examiner* — Guerrier Merant
(74) *Attorney, Agent, or Firm* — IP Legal Services, LLC

(57) ABSTRACT

Provided is a method of requesting, by a terminal, retransmission of a TB. The method may include: receiving a TB configured with K code blocks (CBs) and M code block groups (CBGs) from a base station (BS); determining whether reception of the TB is successful; and transmitting retransmission information about the TB to the BS when it is determined that the reception of the TB fails.

6 Claims, 4 Drawing Sheets

(51) Int. Cl.
*H04L 1/16* (2006.01)
*H03M 13/00* (2006.01)
*H04W 72/04* (2009.01)
*H03M 13/09* (2006.01)
*H04L 5/00* (2006.01)

(56) References Cited

U.S. PATENT DOCUMENTS

2019/0327759 A1* 10/2019 Lee .................. H04L 5/00
2019/0334664 A1* 10/2019 Guan ................. H04L 1/18

OTHER PUBLICATIONS

LG Electronics, "Consideration on CB group based HARQ operation", R1-1707661, 3GPP TSG RAN WG1 Meeting #89, Hangzhou, P.R. China May 15-19, 2017.

* cited by examiner

METHOD OF RETRANSMITTING TRANSMISSION BLOCK FOR NEW RADIO AND APPARATUS USING THE SAME

CROSS REFERENCE TO RELATED APPLICATION

This application claims priority from Korean Patent Application Nos. 10-2017-0067957, filed May 31, 2017 and 10-2018-0035572, filed Mar. 28, 2018, which are hereby incorporated by reference for all purposes as if fully set forth herein.

BACKGROUND OF THE INVENTION

1. Field of the Invention

The present embodiments relate to a method of notifying an error situation for requesting retransmission of a transmission block (TB) in next-generation/5G radio access network (hereinafter, referred to as new radio (NR)).

2. Description of the Prior Art

Recently, the $3^{rd}$ Generation Partnership Project (3GPP) has approved the "Study on New Radio Access Technology", which is a study item for research on next-generation/5G radio access technology. On the basis of such a study item, Radio Access Network Working Group 1 (RAN WG1) has been discussing frame structures, channel coding and modulation, waveforms, and multiple access methods for a new radio (NR). NR is required to be designed not only to provide an improved data transmission rate as compared with that of long term evolution (LTE)/LTE-Advanced, but also to satisfy various requirements in detailed and specific usage scenarios.

An enhanced Mobile BroadBand (eMBB), massive Machine-Type Communication (mMTC), and Ultra Reliable and Low Latency Communication (URLLC) are proposed as representative usage scenarios for the NR In order to meet the requirements of the individual scenarios, it is necessary to design flexible frame structures when compared to those of LTE/LTE-Advanced.

Meanwhile, in radio communication, a cyclic redundancy check (CRC) bit string of a fixed length is inserted per unit information block to detect whether a received signal has an error. By performing a check of a CRC bit string, it is determined that the block has no errors when the CRC check is successful, but it is determined that the block has an error when the check of the CRC bit string fails. In the typical case of 3GPP LTE, a 24-bit CRC is inserted per transmission block (TB), in which is a unit of transmission, in a data channel, and the inserted CRCs are different in type according to code blocks which constitute the TB. With this configuration, when any one of the CRC checks fails in a block received in a reception terminal, a request for retransmission of the whole TB is made through a HARQ-ACK/NACK process. On the other hand, in the NR, there has been a need of a method for requesting retransmission of only some parts of the TB corresponding to an error, instead of requesting retransmission of the whole TB in order to reduce resource use for retransmission.

SUMMARY OF THE INVENTION

The present disclosure is directed to providing a method of requesting retransmission with regard to a transmission block (TB) including a plurality of code blocks (CBs) and code block groups (CBGs) in a case where a request for retransmission of the whole TB has to be made because a CRC check in a unit of a TB fails even though a cyclic redundancy check (CRC) check in units of each individual CB is successful.

According to an aspect of the present disclosure, there is provided a method of requesting retransmission of the TB by a terminal, the method including: receiving a TB configured with K CBs and M CBGs from a base station (BS) where K and M are natural numbers greater than or equal to 1; determining whether reception of the TB is successful; and transmitting retransmission information about the TB to the BS when it is determined that the reception of the TB fails, wherein the retransmission information about the TB is configured with N bits where N is an natural number greater than or equal to 1, and the retransmission information indicates retransmission of a whole TB when a CRC check is successful with regard to all of the CBs that constitute the TB and when a CRC check fails with regard to the whole TB.

According to another aspect of the present disclosure, there is provided a method of receiving retransmission information about a TB in a BS, the method including: transmitting a TB configured with K CBs and M CBGs to a terminal where K and M are natural numbers greater than or equal to 1; and receiving the retransmission information about the TB from the terminal, wherein the retransmission information about the TB is configured with N bits where N is an natural number greater than or equal to 1, and the retransmission information indicates retransmission of a whole TB when a CRC check is successful with regard to all of the CBs that constitute the TB and when a CRC check fails with regard to the whole TB.

According to still another aspect of the present disclosure, there is provided a terminal for requesting retransmission of a TB, the terminal including: a receiver configured to receive a TB configured with K CBs and M CBGs from a BS where K and M are natural numbers greater than or equal to 1; a controller configured to determine whether reception of the TB is successful; and a transmitter configured to transmit retransmission information about the TB to the BS when it is determined that the reception of the TB fails, wherein the retransmission information about the TB is configured with N bits where N is an natural number greater than or equal to 1, and the retransmission information indicates retransmission of a whole TB when a CRC check is successful with regard to all of the CBs that constitute the TB and when a CRC check fails with regard to the whole TB.

According to yet another aspect of the present disclosure, there is provided a BS for receiving retransmission information about a TB, the BS including: a transmitter configured to transmit a TB configured with K CBs and M CBGs to a terminal where K and M are natural numbers greater than or equal to 1; and a receiver configured to receive the retransmission information about the TB from the terminal, wherein the retransmission information about the TB is configured with N bits where N is an natural number greater than or equal to 1, and the retransmission information indicates retransmission of a whole TB when a CRC check is successful with regard to all of the CBs that constitute the TB and a CRC check fails with regard to the whole TB.

BRIEF DESCRIPTION OF THE DRAWINGS

The above and other aspects, features and advantages of the present disclosure will be more apparent from the following detailed description taken in conjunction with the accompanying drawings, in which.

DETAILED DESCRIPTION OF THE EXEMPLARY EMBODIMENTS

Figure 1:
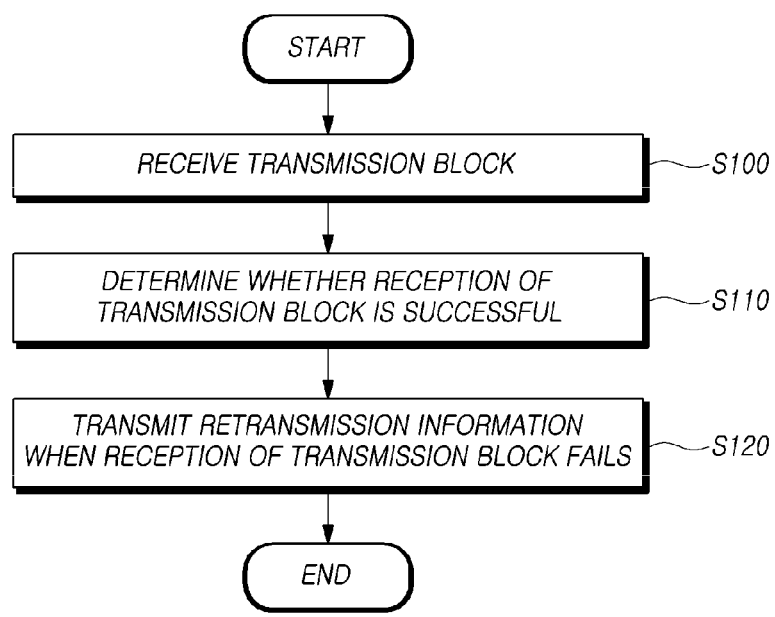
FIG. 1 is a flowchart showing a method of requesting, by a terminal, retransmission of a transmission block (TB) according to one embodiment.

Hereinafter, embodiments of the present disclosure will be described in detail with reference to the accompanying drawings. In adding reference numerals to elements in each drawing, the same elements may be designated by the same reference numerals although the same elements are shown in different drawings. Further, in the following description of the present disclosure, detailed descriptions of functions and configurations related to the known structure may be omitted when it is determined that the descriptions may obscure the subject matter of the present disclosure.

In the present disclosure, a wireless communication system refers to a system for providing various communication services such as a voice service, a packet data service, etc. The wireless communication system may include a user equipment (UE) and a base station (BS).

The UE may be a comprehensive concept that indicates a terminal for use in wireless communication, including a UE used for Wideband Code Division Multiple Access (WCDMA), Long Term Evolution (LTE), High Speed Packet Access (HSPA), International Mobile Telecommunications-2020 (IMT-2020) (5G or new radio), or the like, along with a mobile station (MS), a user terminal (UT), a subscriber station (SS), a wireless device, or the like used for a global system for mobile communications (GSM).

The BS or a cell generally refers to a station where communication with a UE is performed, and the BS or the cell inclusively means all of various coverage areas such as a Node-B, an evolved Node-B (eNB), a gNode-B (gNB), a low power node (LPN), a sector, a site, various types of antennas, a base transceiver system (BTS), an access point, a point (e.g., a transmitting point, a receiving point, or a tranceiving point), a relay node, a megacell, a macrocell, a microcell, a picocell, a femtocell, a remote radio head (RRH), a radio unit (RU), and a small cell.

Each of the above-described various cells has a BS that controls a corresponding cell, and thus, the BS may be construed in two ways. 1) The BS may be a device itself that provides the megacell, the macrocell, the microcell, the picocell, the femtocell, and the small cell in association with a wireless area, or 2) the BS may indicate the wireless area itself. In item 1), the BS may be any device that interacts with another device to enable the device that provides a predetermined wireless area to be controlled by an identical entity or to cooperatively configure the wireless area. Based on a configuration type of the wireless area, a point, a transmission/reception point, a transmission point, a reception point, or the like may be an embodiment of the BS. In item 2), the BS may be the wireless area itself that receives or transmits a signal from a perspective of the terminal or a neighboring BS.

In the present disclosure, the cell may refer to the coverage of a signal transmitted from the transmission/reception point, a component carrier having the coverage of the signal transmitted from the transmission/reception point (transmission point or transmission/reception point), or the transmission/reception point itself.

In the present disclosure, the user equipment and the BS are used as terms for two (uplink and downlink) inclusive transceiving subjects to embody the technology and technical concepts described in the specifications, and may not be limited to a specific term or word.

Here, an uplink (UL) refers to a scheme for the UE to transceive data to the BS, and a downlink (DL) refers to a scheme for the BS to transceive data to the UE.

UL transmission and DL transmission may be performed using i) a time division duplex (TDD) scheme that performs transmission based on different times, ii) a frequency division duplex (FDD) scheme that performs transmission based on different frequencies, or iii) a hybrid scheme of the TDD and FDD schemes.

Further, in the wireless communication system, a standard may be developed by forming an UL and a DL based on a single carrier or a pair of carriers.

The UL and the DL may transmit control information through a control channel, such as a physical DL control channel (PDCCH), a physical UL control channel (PUCCH), and the like, and the UL and the DL may be configured as a data channel, such as a physical DL shared channel (PDSCH), a physical UL shared channel (PUSCH), and the like, so as to transmit data.

The DL may refer to communication or a communication path from a multi-transmission/reception point to the terminal, and the UL may refer to communication or the communication path from the terminal to a multi-transmission/reception point. In the DL, a transmitter may be a part of multiple transmission/reception points and a receiver may be a part of the terminal. In the UL, a transmitter may be a part of the terminal and a receiver may be a part of multiple transmission/reception points.

Hereinafter, a situation in which signals are transmitted and received through a channel such as the PUCCH, the PUSCH, the PDCCH, or the PDSCH, will be expressed as the transmission and reception of the PUCCH, the PUSCH, the PDCCH, or the PDSCH.

Meanwhile, higher layer signaling includes a radio resource control (RRC) signaling that transmits RRC information including an RRC parameter.

The BS performs DL transmission on the terminals. The BS may transmit a physical DL control channel for transmitting DL control information such as scheduling required to receive a DL data channel that is a main physical channel for unicast transmission, and scheduling approval information for transmission on an UL data channel. Hereinafter, transmission and reception of a signal through each channel will be described as transmission and reception of a corresponding channel.

Varied multiple access schemes may be unrestrictedly applied to the wireless communication system. Various multiple access schemes may include time division multiple access (TDMA), frequency division multiple access (FDMA), CDMA, orthogonal frequency division multiple access (OFDMA), non-orthogonal multiple access (NOMA), OFDM-TDMA, OFDM-FDMA, OFDM-CDMA, and the like. Here, NOMA includes sparse code multiple access (SCMA), low cost spreading (LDS), and the like.

Embodiments of the present disclosure may be applicable to resource allocation in an asynchronous wireless communication scheme that evolves into LTE/LTE-advanced and IMT-2020 through GSM, WCDMA, and HSPA. Further-more, the embodiments may be applicable to resource allocation in a synchronous wireless communication scheme that evolves into CDMA, CDMA-2000, and UMB.

In the present disclosure, a Machine Type Communication (MTC) terminal refers to a terminal that is low cost (or low complexity), a terminal that supports coverage enhancement, or the like. Alternatively, in the present disclosure, the MTC terminal refers to a terminal that is defined as a predetermined category for maintaining low costs (or low complexity) and/or coverage enhancement.

In other words, in the present specifications, the MTC terminal may refer to a newly defined $3^{rd}$ Generation Partnership Project (3GPP) Release-13 low cost (or low complexity) UE category/type, which executes LTE-based MTC related operations. Alternatively, in the present specifications, the MTC terminal may refer to a UE category/type that is defined in or before 3GPP Release-12 that supports enhanced coverage in comparison with existing LTE coverage, or supports low power consumption, or may refer to a newly defined Release-13 low cost (or low complexity) UE category/type. Alternatively, the MTC terminal may refer to a further enhanced MTC terminal defined in Release-14.

In the present disclosure, a narrowband Internet of Things (NB-IoT) terminal refers to a terminal supporting radio access for cellular IoT. NB-IoT technologies are aimed at indoor coverage improvement, support for large-scale low-speed terminals, low latency sensitivity, very low terminal costs, low power consumption, and optimized network architecture.

An enhanced Mobile BroadBand (eMBB), massive Machine-Type Communication (mMTC), and Ultra Reliable and Low Latency Communication (URLLC) are proposed as typical usage scenarios for new radio (NR) which has been under discussion in the 3GPP in recent years.

In the present disclosure, a frequency, a frame, a subframe, a resource, a resource block, a region, a band, a sub-band, a control channel, a data channel, a synchronization signal, various reference signals, various signals, and various messages associated with NR may be interpreted as meanings used in the past or present or as various meanings to be used in the future.

As described above, in radio communication, a cyclic redundancy check (CRC) bit string of a fixed length is inserted per unit information block to detect whether a received signal has an error. By performing a check of the CRC bit, it is determined that the block has no errors when the CRC check is successful, but has an error when the CRC check fails. In the typical case of 3GPP LTE, a 24-bit CRC is inserted per transmission block (TB), in which is a unit of transmission, in a data channel, and the inserted CRCs are different in type according to code blocks which constitute the TB. With this configuration, when any one of the CRC checks fails in a block received in a reception terminal, the reception terminal requests for retransmission of the whole TB through a HARQ-ACK/NACK process. In the next generation mobile communication system(i.e., the NR), it is possible to reduce resources required for retransmission of the whole TB by i) inserting a CRC in each of code blocks (CBs) of a TB in addition to an existing CRC inserted in a unit of a TB of the 3GPP LTE/LTE-A; ii) grouping some CBs into a code block group (CBG); iii) performing the CRC check for the CB within the CBG; and iv) requesting retransmission of the CBG when one or more CBs in the corresponding CBG have an error.

In this case, the number of HARQ ACK/NACK bits of the reception terminal with regard to one TB may be determined by the number of transmitted CBGs+α. Here, the necessity and role of α have not been established yet. With this, when some parts of the whole TB have to be subjected to the retransmission as a result of receiving the TB, a block firstly subjected to the retransmission is indicated in the form of a subset of the TB. The retransmitted block may be also divided into several of CBGs, and the HARQ ACK/NACK bits are fed back again as many as the number of CBGs+α in accordance with whether the several of CBGs are successfully received.

When all of the CBs in the TB are successfully received through the foregoing process, the reception terminal joins the successfully transmitted CBs together into a TB and then finally performs the CRC check in a unit of the TB. On the other hand, when the CRC check is performed in the unit of the TB and fails, the reception terminal checks whether the TB has an error, but may not be able to determine which CB has the error (i.e., which CB has been subjected to incorrect determination of the CRC check). Eventually, the reception terminal has to request retransmission with regard to the whole TB. However, there is no method defined yet in the existing HARQ ACK/NACK process for requesting the retransmission of the whole TB, rather than requesting the retransmission of each individual CBG that constitutes the TB.

Hereinafter, methods of a terminal for requesting retransmission of a TB, and methods of a BS for receiving retransmission information about the TB in accordance with various embodiments will be described in more detail.

The embodiments set forth herein may be applied individually or in a combination thereof.

Such methods may be broadly divided into (1) a method of explicitly notifying failure of a CRC performed in a unit of a TB, and (2) a method of implicitly notifying failure of a CRC performed in a unit of a TB. One of the methods may be selected on the basis of a service scenario. Terms are used in the present disclosure only for describing the embodiments, but not limiting the technical scope thereof.

Prior to description of the embodiments, few assumptions may be applied to a system according to the present embodiment. The few assumptions are as follows.

Assumption 1. First, it will be assumed that transmission is performed in a unit of a TB, and the TB is configured with K CBs. Several CBs are grouped into a CBG in one TB, and the CBG is regarded as a subset of the TB. Further, it will be assumed that one TB is configured with M CBGs in a mutually-exclusive and collectively exhaustive (MECE) form.

Assumption 2. When the TB is received, it is determined whether reception of each individual CB is successful or fails. In this case, it is determined that the reception is successful only when a CRC check matches and decryption is not failed. When it is determined that all of the CBs are successfully received, it is further determined whether reception in units of CBGs is successful or fails. This determination process is performed only when the CRC is given in the units of the CBGs. When there are no needs of performing the determination or when it is determined that the reception is successful with regard to all of the CBGs, it is finally determined whether the CRC check is performed in the unit of the TB. Thus, it will be assumed that the reception of the whole TB is successful when the CRC check is passed, but the reception of the whole TB fails when the CRC check is not passed.

Assumption 3. A situation-1 is one of i) when a block to be transmitted is an initial TB, ii) when all CBGs in the TB are retransmitted due to failed reception, and iii) when the number of CBGs is one, i.e., M is 1. Further, a situation-2 is one of i) when a block to be transmitted constitutes the initial TB and ii) when some CBGs smaller than the whole TB are retransmitted.

In the situation-1, the unit of the block to be currently processed matches that of the TB. Accordingly, all HARQ ACK/NACK bits are fed back as NACK when the CRC check performed in the unit of the TB fails even though the CRC check performed in units of all CBs is successful. As a result, it is possible to request retransmission with regard to the whole TB. On the other hand, in the situation-2, a transmission terminal determines that the last-retransmitted block has to be retransmitted, not the whole initial TB, when all HARQ ACK/NACK bits are fed back as NACK even though the CRC check performed in the units of all CBs is successful and the CRC check performed in the unit of the TB fails. Therefore, the present disclosure proposes a method of the reception terminal for giving feedback to the transmission terminal for enabling the transmission terminal to determine that retransmission of the whole initial TB is required in the situation-2.

(1) A method of explicitly notifying (e.g., transmitting) failure of a CRC check performed in a unit of a TB ① A method of inserting an additional bit into a control message: this method refers to a method of additionally inserting a message, in addition to the existing HARQ ACK/NACK, in a control message for feedback of a retransmission block corresponding into the situation-2. For example, one bit is added to the head or tail of a HARQ ACK/NACK bit string so that the existing HARQ ACK/NACK process can be performed when the added bit is '0' but the retransmission of the whole TB can be performed when the added bit is '1'. This method has merits that the transmission terminal performs the retransmission by determining such a situation within the shortest time.

② A method of applying a change to a control channel symbol on the basis of information: this method refers to a method of applying a change, in a form determined by the reception terminal, to the existing control channel symbol in order to make a request for retransmission of the whole TB in the case of a control channel for feedback of a retransmission block corresponding to the situation-2.

In the case of requesting the retransmission of the whole TB, details of embodiments are as follows.

Embodiment-1: a signal is fed back by applying a phase shift of Π/4 to a part or the whole of a control channel symbol.

Embodiment-2: a signal component of a reference signal (RS) to be inserted into a control channel is shifted/mirrored/reversed.

Embodiment-3: a position of an RS to be inserted into a control channel is moved.

Embodiment-4: signal strength is changed in a part or the whole of a control channel symbol ③ A method of inserting additional bit information to only a CRC of a control message: this method refers to a method of reflecting the information to the CRC of the control message without additionally inserting a message besides the existing HARQ ACK/NACK in the case of a control message for feedback of a retransmission block corresponding to the situation-2. This method is similar to the above method except for changing a message bit instead of a symbol.

In the case of requesting the retransmission of the whole TB, details of embodiments are as follows.

Embodiment-1: a part or the whole of CRC bits are reversed or circularly rotated.

Embodiment-2: at initial CRC generation, the CRC is generated on assumption that an additional bit is inserted in addition to the existing message.

(2) A method of implicitly transmitting (e.g., notifying) failure of a CRC check performed in a unit of a TB When requests for retransmission are made more than a certain number of times or when the number of processes is full up due to the subsequent retransmissions of the TB, a typical communication system determines that the transmission of the whole TB fails and performs a new operation for the transmission. Accordingly, a UE (or a terminal) may intentionally include the corresponding operation, thereby resulting in retransmittion of the whole TB.

① A method of unconditionally inserting NACK in a feedback bit: This method refers to a terminal (or UE) behavior in which the NACK is continuously fed back as long as the CRC check performed in the unit of the whole TB fails even though each individual CB has passed the CRC check. To this end, the UE may insert the NACK at a certain position or insert the NACK in the whole or at a specific position of the HARQ ACK/NACK bits. In particular, it may be defined that the NACK may be transmitted for the head bit or the tail bit to reduce the amount of data to be transmitted and received in response to a retransmission request just for raising a retransmission count, or the NACK is unconditionally transmitted for the whole positions to start the whole retransmission process and more quickly perform the retransmission when the feedback of the whole NACK is repeated more than a specific value defined by a standard consensus.

FIG. 1 is a flowchart illustrating a method of requesting, by a terminal, retransmission of a TB according to one embodiment.

Referring to FIG. 1, first, the terminal may receive a TB configured with K CBs and M CBGs from a BS (S100), wherein K and M are natural numbers greater than or equal to 1.

Then, the terminal may determine whether the reception of the TB received in operation S100 is successful (S110). As described above, the terminal i) performs a CRC check in the units of each individual CB that constitutes the TB and ii) performs the CRC check in the unit of the whole TB. When both the CRC check in the units of each individual CB that constitutes the TB and the CRC check in the unit of the whole TB are successful, the terminal determines that the TB is successfully received. On the other hand, when at least one of CBs fails in the CRC check or when the CRC check performed in the unit of the whole TB fails, the terminal determines failures in the reception of the TB.

Further, when it is determined in operation S110 that the reception of the TB fails, the terminal may transmit retransmission information about the TB to the BS (S120). The retransmission information about the TB is configured with N bits, wherein N is a natural number greater than or equal to 1. For example, each of N bits configuring the retransmission information may indicates whether different CBGs corresponding to the bits will be retransmitted. Alternatively, when N is greater than M, each of the M bits among N bits configuring the retransmission information may indicate whether different CBGs corresponding to the bits will be retransmitted.

In this case, as a method of determining the N value, N may be given to the terminal through higher layer signaling (e.g., RRC signaling), or N may be determined to be equal to M.

When N is given to the terminal through the higher layer signaling, N may be greater than M. That is, the number of bits configuring the retransmission information may be greater than the number of CBGs that constitute the TB. Thus, there may be no CBGs corresponding to some bits. In this case, M bits from the head among N bits may be mapped to different CBGs, and the last (N-M) bits may be always set to NACK bits.

On the other hand, when N is equal to M, N bits may be mapped to different CBGs and each bit may indicate whether to retransmit a specific CBG. When the CRC check is successful with regard to all of the CBs of the TB but the CRC check fails with regard to the whole TB, the retransmission information transmitted to the BS may indicate the retransmission of the whole TB. As an example of indicating the retransmission of the whole TB, there may be a method, which includes setting NACK bits with regard to all N bits configuring the retransmission information as described above.

Figure 2:
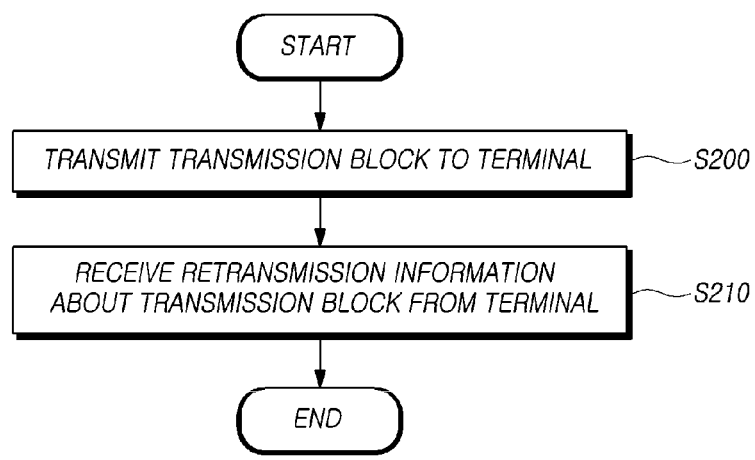
FIG. 2 is a flowchart showing a method of receiving retransmission information about a TB in a base station according to one embodiment.

FIG. 2 is a flowchart illustrating a method of receiving retransmission information about a TB in a BS according to one embodiment.

Referring to FIG. 2, first, the BS may transmit a TB configured with K CBs and M CBGs to a terminal (S200), wherein K and M are natural numbers greater than or equal to 1.

Further, the BS may receive the retransmission information about the TB, which is transmitted in operation S200, from the terminal (S210). As described with reference to FIG. 1, when it is determined that the terminal fails in receiving the TB, the terminal transmits the retransmission information about the TB to the BS so that the BS can receive the retransmission information. The retransmission information about the TB is configured with N bits, wherein N is a natural number greater than or equal to 1. For example, N bits configuring the retransmission information may indicate whether different CBGs corresponding to the bits will be retransmitted. Alternatively, when N is greater than M, each of the M bits among N bits configuring the retransmission information may indicate whether different CBGs corresponding to the bits will be retransmitted.

In this case, as a method of determining the foregoing N value, as described with reference to FIG. 1, N may be given to the terminal through higher layer signaling (e.g., RRC signaling), or N may be determined to be equal to M.

When N is given to the terminal through the higher layer signaling, N may be greater than M. That is, the number of bits configuring the retransmission information may be greater than the number of CBGs that constitute the TB, and therefore there may be no CBGs corresponding to some bits. In this case, M bits from the head among N bits may be mapped to different CBGs, and the last (N-M) bits may be always set to NACK bits.

On the other hand, when N is equal to M, N bits may be mapped to different CBGs and each bit may indicate whether to retransmit a corresponding CBG.

When the CRC check is successful with regard to all of the CBs of the TB but the CRC check fails with regard to the whole TB, the retransmission information received in the BS may indicate the retransmission of the whole TB. As an example of indicating the retransmission of the whole TB, there may be a method of setting NACK bits with regard to all N bits configuring the retransmission information as described above.

Figure 3:
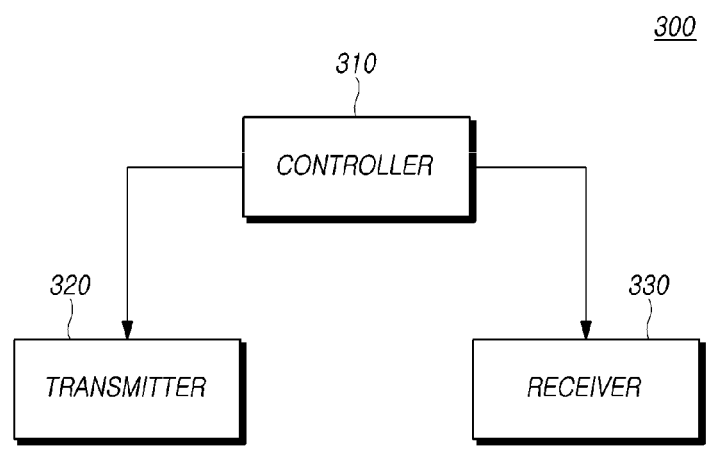
FIG. 3 illustrates a base station according to an embodiment.

FIG. 3 illustrates a BS according to an embodiment.

Referring to FIG. 3, a BS 300 includes a controller 310, a transmitter 320, and a receiver 330.

The controller 310 may control general operations of the BS to receive retransmission information about a TB.

The transmitter 320 and the receiver 330 may be used in transmitting and receiving a signal, a message and data, which may be used to materialize the above-described present disclosure, to and from a terminal.

Specifically, the transmitter 320 may transmit a TB configured with K CBs and M CBGs to a terminal, wherein K and M are natural numbers greater than or equal to 1.

Further, the receiver 330 may receive the retransmission information about the TB from the terminal. As described with reference to FIG. 1, when it is determined that the terminal fails in receiving the TB, the terminal transmits the retransmission information about the TB to the BS so that the BS can receive the retransmission information. The retransmission information about the TB is configured with N bits, wherein N is a natural number greater than or equal to 1. For example, N bits configuring the retransmission information may indicate whether different CBGs corresponding to the bits will be retransmitted. Alternatively, when N is greater than M, each of the M bits among N bits configuring the retransmission information may indicate whether different CBGs corresponding to the bits will be retransmitted.

In this case, as a method of determining the N value, as described with reference to FIG. 1, N may be given to the terminal through higher layer signaling (e.g., RRC signaling), or N may be determined to be equal to M.

When N is given to the terminal through the higher layer signaling, N may be greater than M. That is, the number of bits configuring the retransmission information may be greater than the number of CBGs that constitute the TB, and therefore there may be no CBGs corresponding to some bits. In this case, M bits from the head among N bits may be mapped to different CBGs, and the last (N-M) bits may be always set to NACK bits.

On the other hand, when N is equal to M, N bits may be mapped to different CBGs and each bit may indicate whether to retransmit a corresponding CBG.

When the CRC check is successful with regard to all of the CBs of the TB but the CRC check fails with regard to the whole TB, the retransmission information received in the BS may indicate the retransmission of the whole TB. As an example of indicating the retransmission of the whole TB, there may be a method of setting NACK bits with regard to all N bits configuring the retransmission information as described above.

Figure 4:
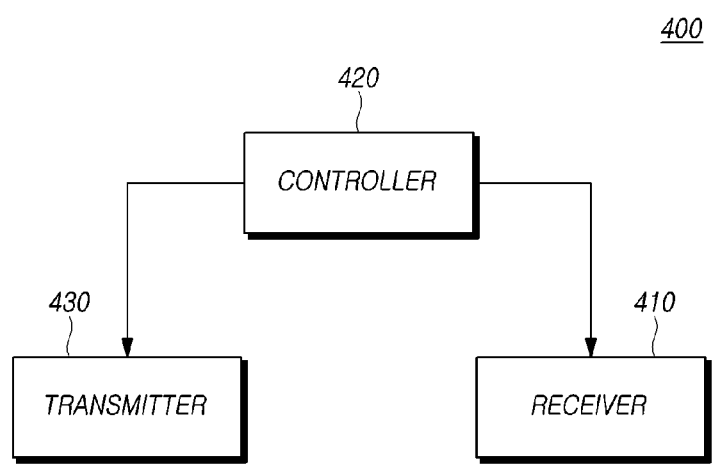
FIG. 4 illustrates a terminal according to an embodiment.

FIG. 4 illustrates a terminal according to an embodiment.

Referring to FIG. 4, a terminal 400 includes a receiver 410, a controller 420, and a transmitter 430.

The receiver 410 may receive a TB configured with K CBs and M CBGs from a BS, wherein K and M are natural numbers greater than or equal to 1.

The controller 420 may determine whether reception of the TB received in the receiver 410 is successful. As described above, the terminal performs a CRC check in the units of the CBs that constitutes the TB and performs a CRC check in the unit of the whole TB. When both the CRC check in the units of each individual CB that constitutes the TB and the CRC check in the unit of the whole TB are successful, the terminal determines that the TB is successfully received. On the other hand, when at least one of the CBs fails in the CRC check or when the CRC check performed in the unit of the whole TB fails, the terminal determines that the reception of the TB fails.

When it is determined that the reception of the TB received in the receiver 410 fails, the transmitter 430 may transmit retransmission information about the TB to the BS. The retransmission information about the TB is configured with N bits, wherein N is a natural number greater than or equal to 1. For example, N bits configuring the retransmission information may indicate whether different CBGs corresponding to the bits will be retransmitted. Alternatively, when N is greater than M, M bits among N bits configuring the retransmission information may indicate whether different CBGs corresponding to the bits will be retransmitted.

In this case, as a method of determining the foregoing N value, N may be given to the terminal through higher layer signaling (e.g., RRC signaling), or N may be determined to be equal to M.

When N is given to the terminal through the higher layer signaling, N may be greater than M. That is, the number of bits configuring the retransmission information may be greater than the number of CBGs that constitute the TB, and therefore there may be no CBGs corresponding to some bits. In this case, M bits from the head among N bits may be mapped to different CBGs, and the last (N-M) bits may be always set to NACK bits.

On the other hand, when N is equal to M, N bits may be mapped to different CBGs and each bit may indicate whether to retransmit a corresponding CBG.

When the CRC check is successful with regard to all of the CBs of the TB but the CRC check fails with regard to the whole TB, the retransmission information transmitted to the BS may indicate the retransmission of the whole TB. As an example of indicating the retransmission of the whole TB, there may be a method of setting NACK bits with regard to all N bits configuring the retransmission information as described above.

With the methods according to the foregoing embodiments, a transmission terminal can recognize and determine at a appropriate time when a reception terminal has successful CRC checks with regard to all CBs but a failed CRC check with regard to a TB. Thus, the transmission terminal may start a process of retransmitting the whole TB.

Reference details or reference documents described in the above embodiments are omitted for the simplicity of the description of the specification but still constitute a part of the present specification. Therefore, when a part of the contents of the reference details and the reference documents is added to the present specifications or is disclosed in the claims, it should be construed as falling within the scope of the present disclosure.

The above embodiments of the present disclosure have been described only for illustrative purposes, and those skilled in the art may appreciate that various modifications and changes may be made thereto without departing from the scope and spirit of the present disclosure. Therefore, the embodiments of the present disclosure are not intended to limit, but are intended to illustrate the technical idea of the present disclosure, and the scope of the technical idea of the present disclosure is not limited by the embodiments. The scope of the present disclosure shall be construed on the basis of the accompanying claims in such a manner that all of the technical ideas included within a scope equivalent to the claims belong to the present disclosure.

Moreover, the terms "system," "processor," "controller," "component," "module," "interface,", "model," "unit" or the like are generally intended to refer to a computer-related entity, either hardware, a combination of hardware and software, software, or software in execution. For example, a component may be, but is not limited to being, a process running on a processor, a processor, a controller, a control processor, an object, an executable, a thread of execution, a program, and/or a computer. By way of illustration, both an application running on a controller or processor and the controller or processor can be a component. One or more components may reside within a process and/or thread of execution and a component may be localized on one computer and/or distributed between two or more computers.

What is claimed is:

1. A method of requesting, by a terminal, retransmission of a transmission block (TB), the method comprising:
    receiving a TB configured with K code blocks (CBs) and M code block groups (CBGs) from a base station (BS) where K and M are natural numbers greater than or equal to 1;
    determining whether reception of the TB is successful; and
    transmitting retransmission information about the TB to the BS when the reception of the TB fails,
    wherein the retransmission information about the TB is configured with N bits where N is a natural number greater than or equal to 1,
    the retransmission information indicates retransmission of a whole TB when a cyclic redundancy check (CRC) check is successful with regard to all of the CBs of the TB and when a CRC check fails with regard to the whole TB,
    wherein the N value is given through higher layer signaling, and
    wherein, when the N value is greater than the M value, a first set of M bits of the N bits are mapped to different CBGs, and a last set of (N-M) bits of the N bits are set to NACK bits.

2. The method according to claim 1, wherein all of the N bits are set to NACK bits when the CRC check is successful with regard to all of the CBs that constitute the TB and when the CRC check fails with regard to the whole TB.

3. A method of receiving retransmission information about a transmission block (TB) in a base station (BS), the method comprising:
    transmitting a TB configured with K code blocks (CBs) and M code block groups (CBGs) to a terminal where K and M are natural numbers greater than or equal to 1; and
    receiving the retransmission information about the TB from the terminal,
    wherein the retransmission information about the TB is configured with N bits, N is a natural number greater than or equal to 1,
    the retransmission information indicates retransmission of a whole TB when a cyclic redundancy check (CRC) check is successful with regard to all of the CBs that constitute the TB and when a CRC check fails with regard to the whole TB,
    wherein the N value is indicated through higher layer signaling, and
    wherein, when the N value is greater than the M value, a first set of M bits of the N bits are mapped to different CBGs, and a last set of (N-M) bits of the N bits are always set to NACK bits.

4. The method according to claim 3, wherein all of the N bits are set to NACK bits when the CRC check is successful with regard to all of the CBs that constitute the TB and when the CRC check fails with regard to the whole TB.

5. A terminal for requesting retransmission of a transmission block (TB), the terminal comprising:
    a receiver configured to receive a TB configured with K code blocks (CBs) and M code block groups (CBGs) from a base station (BS) where K and M are natural numbers greater than or equal to 1;

a controller configured to determine whether reception of the TB is successful; and a transmitter configured to transmit retransmission information about the TB to the BS when the reception of the TB fails, wherein the retransmission information about the TB is configured with N bits where N is a natural number greater than or equal to 1, the retransmission information indicates retransmission of a whole TB when a cyclic redundancy check (CRC) check is successful with regard to all of the CBs that constitute the TB and when a CRC check fails with regard to the whole TB, wherein the N value is given through higher layer signaling, and wherein, when the N value is greater than the M value, a first set of M bits of the N bits are mapped to different CBGs, and a last set of (N-M) bits of the N bits are always set to NACK bits.

6. The terminal according to claim 5, wherein all of the N bits are set to NACK bits when the CRC check is successful with regard to all of the CBs that constitute the TB and when the CRC check fails with regard to the whole TB.

* * * * *